(12) United States Patent
Siemieniec et al.

(10) Patent No.: US 8,871,593 B1
(45) Date of Patent: Oct. 28, 2014

(54) SEMICONDUCTOR DEVICE WITH BURIED GATE ELECTRODE AND GATE CONTACTS

(71) Applicant: Infineon Technologies Austria AG, Villach (AT)

(72) Inventors: Ralf Siemieniec, Villach (AT); Michael Hutzler, Villach (AT); Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/942,007

(22) Filed: Jul. 15, 2013

(51) Int. Cl.
*H01L 21/336* (2006.01)
*H01L 29/66* (2006.01)
*H01L 29/78* (2006.01)

(52) U.S. Cl.
CPC ...... *H01L 29/7827* (2013.01); *H01L 29/66666* (2013.01)
USPC ............................ 438/272; 438/176; 257/396

(58) Field of Classification Search
CPC .................. H01L 21/2815; H01L 29/4925
USPC .................. 438/156, 176, 177, 193, 271, 272; 257/396, 397
See application file for complete search history.

(56) References Cited

U.S. PATENT DOCUMENTS

| 7,858,478 | B2* | 12/2010 | Hirler | 438/270 |
| 2013/0119462 | A1* | 5/2013 | Kye et al. | 257/331 |
| 2013/0341710 | A1* | 12/2013 | Choi et al. | 257/330 |

* cited by examiner

*Primary Examiner* — Caridad Everhart
(74) *Attorney, Agent, or Firm* — Murphy, Black & Homiller, PLLC (57) ABSTRACT

A semiconductor device includes a gate electrode buried in a semiconductor portion. The gate electrode includes a first gate portion on a first side of a longitudinal center axis of the gate electrode parallel to the main surface and a second gate portion on an opposite, second side of the longitudinal center axis. At least one first gate contact extends from a main side defined by a main surface into the first gate portion.

20 Claims, 8 Drawing Sheets

FIG 4

SEMICONDUCTOR DEVICE WITH BURIED GATE ELECTRODE AND GATE CONTACTS

BACKGROUND

Typical power semiconductor switching devices are designed for low area specific on-state resistance $Rds_{on}*A$. A further quality measure is the FOM (figure of merit) given by the product of the on-state resistance $Rds_{on}$ and the gate charge that ideally does not degrade when decreasing the on-state resistance $Rds_{on}$. A further design constraint is the $FOM_{oss}$ given by the product of the on-state resistance and the output charge that is ideally as low as possible.

Power semiconductor devices with vertical channels, e.g., trench-type MOSFETs (metal oxide semiconductor field effect transistors) typically include regularly arranged electrode structures buried in a semiconductor portion between active transistor areas of FET cells. Each buried electrode structure may include a gate and a field electrode, wherein the field electrode is buried deeper in the semiconductor portion than the gate electrode. In a reverse blocking mode, the field electrodes deplete active transistor areas in a lateral direction such that, without suffering from a loss of reverse blocking capabilities, the impurity concentration in the active transistor areas may be increased, thus decreasing the on-state resistance $Rds_{on}$. It is desirable to provide semiconductor devices with buried gate electrodes and reliable gate contacts that can be provided in a cost effective manner.

SUMMARY

An embodiment refers to a semiconductor device with a gate electrode buried in a semiconductor portion. The gate electrode includes a first gate portion on a first side of a longitudinal center axis of the gate electrode parallel to a main surface of the semiconductor portion and a second gate portion on an opposite, second side of the longitudinal center axis. At least one first gate contact extends from a main side defined by the main surface into the first portion.

Another embodiment refers to a method of manufacturing a semiconductor device. A buried electrode structure is provided in a semiconductor substrate. The buried electrode structure includes a gate electrode with a first gate portion on a first side of a longitudinal center axis parallel to a main surface of the semiconductor substrate and a second gate portion on an opposite, second side of the longitudinal center axis. One or more first gate contacts are provided, wherein the first gate contacts extend from a main side defined by the main surface into the first gate portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "e"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
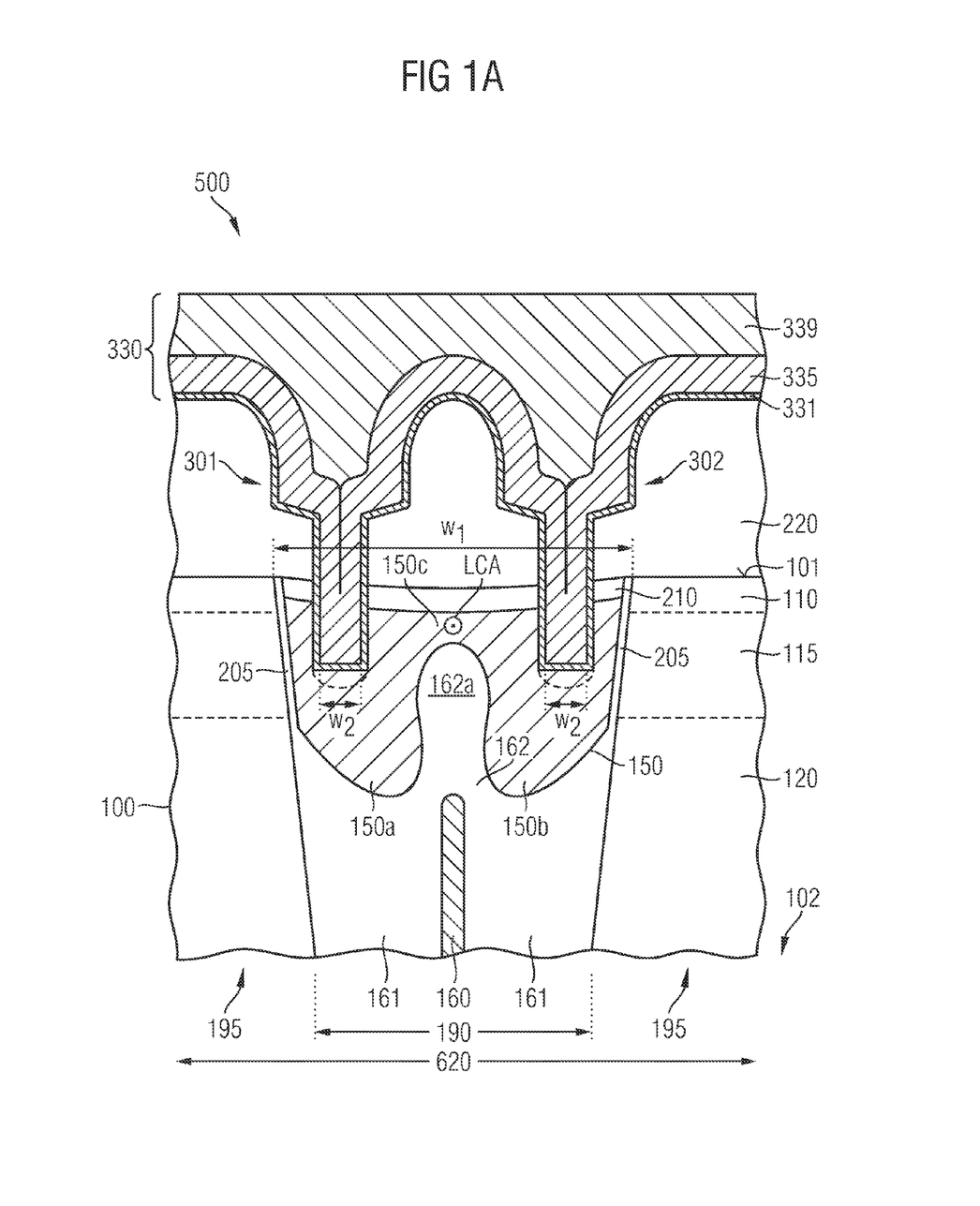
FIG. 1A is a schematic cross-sectional view of a portion of a semiconductor device according to an embodiment providing dual gate contacts in the same cross-sectional plane orthogonal to a longitudinal center axis of a buried electrode structure in a gate connection area.
Figure 1B:
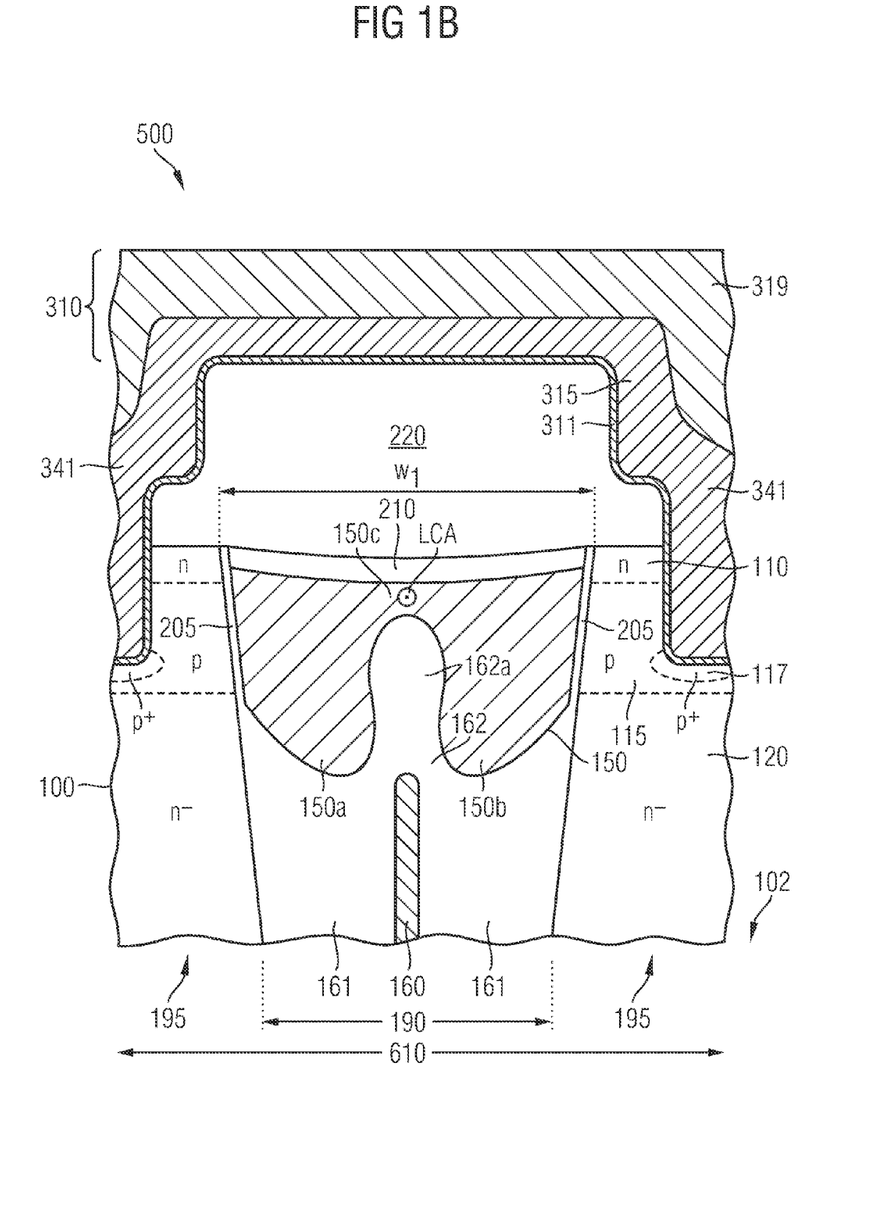
FIG. 1B is a schematic cross-sectional view of the semiconductor device of FIG. 1A in a plane parallel to the cross-sectional plane in a cell area.

FIGS. 1A and 1B refer to a semiconductor device 500 with two gate contacts 301, 302 per gate electrode. The semiconductor device 500 includes a semiconductor portion 100 of a single-crystalline semiconductor material, which may be silicon Si, germanium Ge, a silicon germanium crystal SiGe, gallium nitride GaN or gallium arsenide GaAs, by way of example. The semiconductor portion has a planar main surface 101 and a planar rear side surface 102 parallel to the main surface 101. A normal to the main surface 101 defines a vertical direction and directions orthogonal to the vertical direction are lateral directions.

Buried electrode structures 190 extend from a plane spanned by the main surface 101 into the semiconductor portion 100. Sections of the semiconductor portion 100 between the buried electrode structures 190 form semiconductor mesas 195. The buried electrode structures 190 may form a pattern of regularly arranged parallel stripes of approximately uniform width and depth. The width w1 of the buried electrode structures 190 at the main surface 101 may range from several 100 nm, for example from 500 nm, to 2.5 µm, by way of example. According to some embodiments, the width w1 may be about 950 nm, 1.2 µm, or 1.45 µm. The depth of the buried electrode structures 190 may reach several micrometers. The center-to-center distance (pitch) of the buried electrode structures 190 may range from 500 nm to 5.0 µm. The buried electrode structures 190 may have approximately vertical sidewalls. According to the illustrated embodiment, the sidewalls of the buried electrode structures 190 taper with increasing distance to the main surface 101.

Each of the buried electrode structures 190 includes a gate electrode 150 buried in the semiconductor portion 100 below the main surface 101. A top surface of the gate electrode 150 oriented to the main surface 101 may be inwardly bent or concave. The gate electrode 150 may have a U-shaped profile at the top surface. For example, a CMP (chemical mechanical polishing) removing deposited gate material at a higher rate than the material of the semiconductor mesas 195 or an oxide layer covering the semiconductor mesas 195 may dish the top surface of the gate electrode 150.

A gate dielectric 205 insulates the gate electrode 150 from the semiconductor mesas 195. The buried electrode structures 190 may also include a field electrode 160, wherein the field electrode 160 is closer to the rear side portion 100 than the gate electrode 150. A first field dielectric 161 insulates the field electrode 160 from the semiconductor portion 100 and a second field dielectric 162 dielectrically insulates the field electrode 160 from the gate electrode 150.

Some or all of the gate electrodes 150 may be electrically coupled or connected to a gate terminal of the semiconductor device 500 or to an output of a gate driver circuit integrated in the semiconductor device 500. Some of the gate electrodes 150 may be deactivated by applying a predefined potential in order to reduce the gate charge at the expense of on-state conductivity. For example, some of the gate electrodes 150 may be electrically connected with a source terminal or any other structure having the source potential during operation.

The field electrodes 160 may be electrically coupled or connected to a field terminal of the semiconductor device 500, to an output of a driver circuit integrated in the semiconductor device 500, to the source terminal or to any other structure having the source potential during operation.

The gate and field electrodes 150, 160 may be provided from the same or from different conductive materials.

According to an embodiment, the gate electrode 150 and the field electrode 160 may consist of or may contain a portion of heavily doped polycrystalline silicon. The gate and field electrodes 150, 160 may contain a metal containing portion. The gate dielectric 205 may consist of or contain a semiconductor oxide layer, e.g., a thermally grown silicon oxide, a deposited silicon oxide layer, a silicon nitride layer or a silicon oxynitride layer. The first and second field dielectric 161, 162 may consist of or contain a thermal semiconductor oxide, for example a thermally grown silicon oxide. A cap dielectric 210 may be thermally grown on the top surface of the gate electrode 150.

In a central portion of the buried electrode structure 190, the second field dielectric 162 may include a protruding portion 162a thinning the gate electrode 150 from the side of the field electrode 160. For example, after introducing trenches from the main surface 101 into the semiconductor portion 100 a thick oxide may be formed by deposition or thermally growth, wherein the thick oxide lines the introduced trenches. Field electrode material may be deposited and recessed such that the field electrode material fills the remaining voids in the trenches lined by the thick oxide. The thick oxide may be recessed from the main surface 101 wherein remnants of the thick oxide form the first field dielectric 161 and wherein in the center of the introduced trenches a protruding portion of the field electrode material is exposed. An oxidation process may oxidize the protruding exposed portion of the field electrode material to form the second field dielectric 162 with the protruding portion 162a in place of the former protruding exposed portion of the field electrode material.

The protruding portion 162a of the second field dielectric 162 patterns the gate electrode 150 in a first and a second gate portion 150a, 150b on opposite sides of a longitudinal center axis (LCA) of the gate electrode 150 that runs parallel to the main surface 101 and perpendicular to the cross-sectional plane depicted in FIG. 1A. Apart from process induced variations, the first and second gate portions 150a, 150b are approximately mirror-inverted with respect to a plane of symmetry through the longitudinal center axis (LCA) and perpendicular to the main surface 101. A third gate portion 150c having a smaller vertical extension than the first and second gate portions 150a, 150b may structurally and electrically connect the first and second gate portions 150a, 150b. According to other embodiments, the first and second portions 150a, 150b may directly adjoin each other. For concave gate electrodes 150, the third gate portion 150c may have a greater distance to a plane spanned by the main surface 101 than the first and second gate portions 150a, 150b.

At least one first gate contact 301 extends from a main side defined by the main surface 101 into the first gate portion 150a. At least one second gate contact 302 may extend from the main side into the second gate portion 150b. Pairs of the first and second gate contacts 301, 302 may be arranged along a lateral direction perpendicular to the longitudinal center axis (LCA), respectively. According to other embodiments, the first and second gate contacts 301, 302 are arranged alternatingly on both sides of the longitudinal center axis (LCA).

An embodiment provides one single first gate contact 301. Another embodiment provides one single pair of one first gate contact 301 and one second gate contact 302. Other embodiments provide two or more first and second gate contacts 301, 302, wherein the number of first gate contacts 301 may be equal to the number of second gate contacts 302. The first gate contacts 301 may be arranged along an axis parallel to the longitudinal center axis (LCA). The second gate contacts 302 may be arranged along an axis parallel to the longitudinal center axis (LCA).

The first and second gate contacts 301, 302 have a minimum distance to the gate dielectric 205 assigned to the respective gate portion 150a, 150b. The minimum distance may be at least 20 nm, for example at least 100 nm. The first and second gate contacts 301, 302 may have the same minimum distance to the protruding portion 162a of the second field dielectric 162 and the same distance to the longitudinal center axis (LCA), respectively.

The first and second gate contacts 301, 302 may have the same vertical extension with respect to the main surface 101, the same cross-sectional shape and size, and the same structure and internal configuration. The lateral cross-sectional shapes of the first and second gate contacts 301, 302 may be circles, ovals, ellipses or rectangles, e.g., squares, with or without rounded corners. A width w2 of the first and second gate contacts 301, 302 may be between 50 and 400 nm, for example between 150 and 350 nm. According to an embodiment, the width w2 of the first and second gate contacts 301, 302 ranges from 200 to 280 nm.

A dielectric structure 220 may cover the main surface 101. The dielectric structure 220 may be a single layer or may include two or more sub-layers of silicon oxide, silicon nitride, silicon oxynitride, silicon oxide obtained using TEOS (tetra ethyl ortho silane) as precursor material, BSG (boron silicate glass), PSG (phosphorus silicate glass), BPSG (boron phosphorus silicate glass) or a polymer, e.g., polyimide.

The first and second gate contacts 301, 302 electrically connect a gate wiring 330 with the gate electrode 150 through openings in the dielectric structure 220. The gate wiring 330 and the first and second gate contacts 301, 302 may include a thin barrier layer 331 that may be a layer consisting of or containing titanium nitride TiN, titanium Ti, tantalum Ta, and/or tantalum nitride TaN, by way of example. The barrier layer 331 may have a thickness of less 100 nm, e.g., at most 20 nm. An approximately conformal fill material 335 forms fill portions of the first and second gate contacts 301, 302 and provides a base layer of the gate wiring 330. The gate wiring 330 includes a main layer 339 that may contain heavily doped polycrystalline silicon and/or a metal, such as aluminum Al and/or copper Cu or both, for example AlCu, AlSiCu, or AlSi.

FIG. 1A refers to a gate connection portion 620, where the semiconductor mesas 195 may include in substance inactive portions of a drift layer 120 of a first conductivity type and inactive portions of a base/channel layer 115 of a second, complementary conductivity type. A pn junction between the base/channel layer 115 and the drift layer 120 may be approximately adjusted to a lower edge of the gate dielectric 205 at a distance to the main surface 101.

Conventional approaches providing one single gate contact in a central portion of the buried electrode structure 190 have to consider the reduced vertical extension of the gate electrode 150 in the third gate portion 150c when etching contact grooves for the gate contact from the main surface 101 into the gate electrode 150. For example, a plasma etch that cuts through the third portion 150c may damage the second field dielectric 162 between the finalized gate and field electrodes 150, 160. A damaged second field dielectric 162 may reduce the reliability of transistor cells assigned to the concerned buried electrode structure 190. Instead, the present dual gate contact approach provides comparatively deep gate contacts 301, 302 without requiring a sophisticated etch endpoint detection regime for the gate contact groove etch.

Further, with conventional approaches, when the gate contact groove etch exposes the surface of the protruding portion 162a, which becomes wider than the gate contact groove with increasing distance to the main surface 101, the etch tends to proceed along an interface between the gate electrode material and the protruding portion 162a, resulting in narrow channels between the gate electrode material and the protruding portion 162a. The resulting negative taper of the narrow channels makes it difficult to cover the sidewalls of the resulting contact groove with a contiguous barrier layer 331. Defects, weak spots and holes in the barrier layer 331 may cause wormholes during the subsequent deposition of the fill material 335, e.g., a tungsten layer. A leaky barrier layer 331 reduces the reliability of the finalized semiconductor device 500. Instead, the present double gate contact approach allows the formation of the gate contact grooves in a distance to the protruding portion 162a of the second field dielectric 162 and ensures formation of a contiguous barrier layer 331 without breaches and holes and in gate contact grooves with vertical or positively tapering sidewalls.

The buried end faces of the first and second gate contacts 301, 302 can be formed with high reliability at a distance of at least 50 nm, for example at least 100 nm, to the second field dielectric 162. The gate electrode material below the first and second gate contacts can absorb impurities that are implanted through the bottom of the gate contact grooves before formation of the first and second gate contacts 301, 302 in the gate contact grooves. As a result, during manufacture of the semiconductor device 500, the contact grooves for the first and second gate contacts 301, 302 may be formed simultaneously with contact grooves for source and body contacts in a cell area 610 shown in FIG. 1B and an implant through the bottoms of the contact grooves in both the gate connection area 620 and the cell area 610 may be performed without adversely affecting portions of the second field dielectric 162 that is covered by a sufficiently thick portion of the gate electrode material.

The thickness of the third gate portion 150c is a function of the width w1 of the buried electrode structure 190 that in turn is a function of the reverse blocking voltage for which the semiconductor device 500 is specified. Since the contact grooves for the gate contacts 301, 302 are simultaneously formed with the contact grooves for, e.g., source contacts and field electrode contacts, the width of the contact grooves for the gate contacts 301, 302 and the etch process for the contact grooves must be finely adjusted for each type of semiconductor device separately. Instead, with the present dual gate approach, the formation of the contact grooves for the gate contacts 301, 302 is to a high degree independent from the vertical extension of the third gate portion 150c, and hence the processes for etching the contact grooves for the gate contacts 301, 302 for semiconductor devices 500 specified for different breakdown voltage classes can be more easily tuned.

The buried electrode structures 190 may be regularly arranged stripe structures running through a gate connection area 620 as illustrated in FIG. 1A and a cell area 610 as illustrated in FIG. 1A and between the cell area 610 and the gate connection area 620.

FIG. 1B is a cross-sectional view of the semiconductor device 500 with the buried electrode structure 190 of FIG. 1A in a cross-sectional plane parallel to the cross-sectional plane of FIG. 1A in a cell area 610. In the cell area 610, instead of the gate wiring 330, the dielectric structure 220 separates a source metallization 310 that may have the same structure and internal configuration as the gate wiring 330 from the main surface 101. Source contacts 341 extend through openings in the dielectric structure 220 into active transistor areas in semiconductor mesas 195 between adjacent buried electrode structures 190. The source contacts 341 may have the same structure and internal configuration as the first and second gate contacts 301, 302 of FIG. 1A. The lateral cross-sectional shape and size of the source contacts 341 may differ from that of the gate contacts 301, 302. The source contacts 341 may cut through source zones 110 of the first conductivity type formed in the semiconductor mesas 195 in the cell area 610 and may extend into the body/channel layer 115 of the second conductivity type. Heavily doped contact zones 317 may be formed at the buried end faces of the source contacts 341. As a result of dishing that occurs during a chemical mechanical polishing during the recess of the gate material, an upper edge of the gate electrode 150 may be concave.

Contact grooves for the source contacts 341 may be formed contemporaneously with and using the same lithography mask that is used for the contact grooves for the first and second gate contacts 301, 302 of FIG. 1A. The heavily doped contact zone 117 may be formed with the contact grooves for the gate contacts 301, 302 being exposed, since a sufficiently thick layer of gate material absorbs the implanted impurities and shields the second field dielectric 162 against the implanted impurities.

A total contact area between the gate contacts 301, 302 and the gate electrode 150 may be the same or greater as for a single gate contact such that the contact resistance between the gate wiring 310 and the gate electrode 150 is not increased.

Figure 2A:
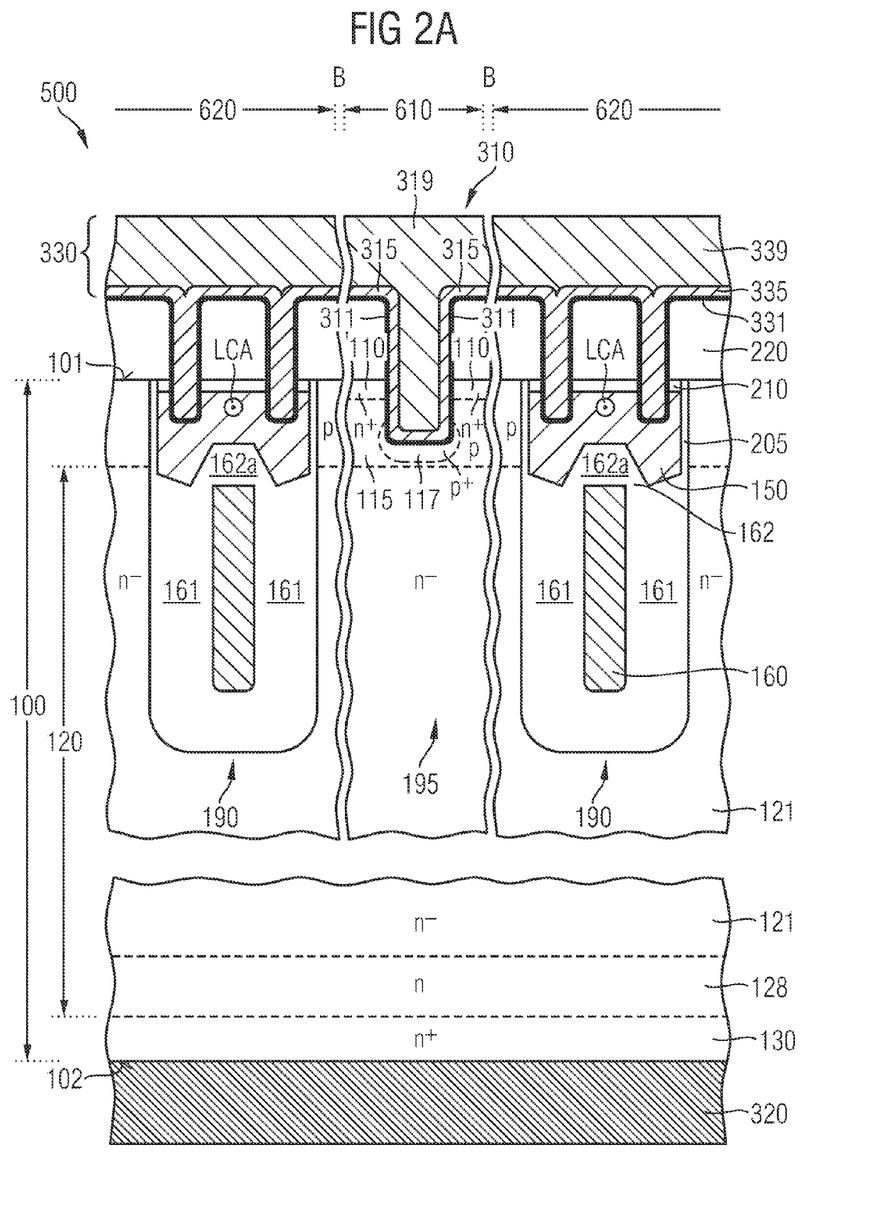
FIG. 2A is a combined schematic cross-sectional view of an IGFET (insulated gate field effect transistor) from two parallel cross-sectional planes in a cell and a gate connection area in accordance with an embodiment providing dual gate contacts for gate electrodes with a thin central portion.
Figure 2B:
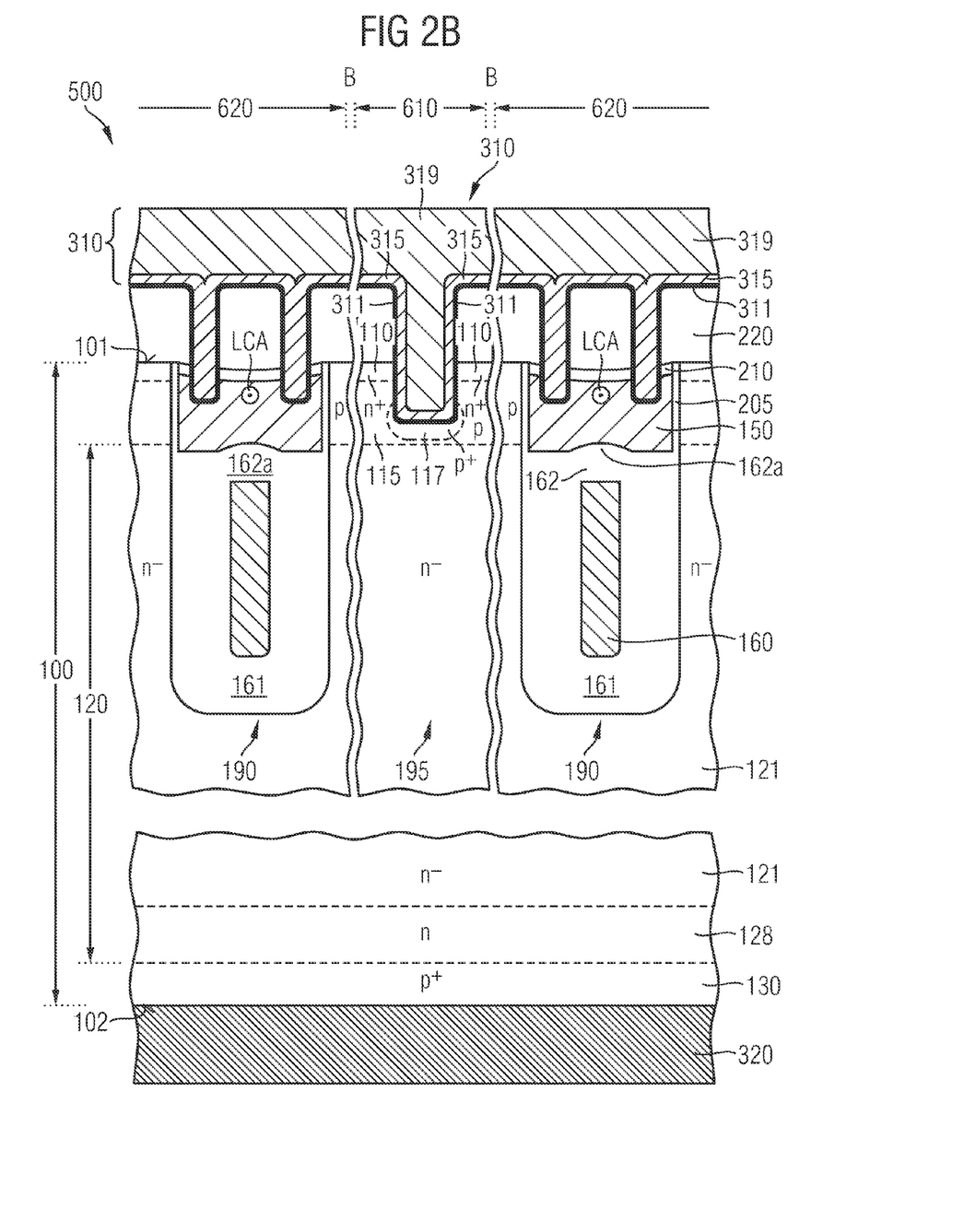
FIG. 2B is a combined schematic cross-sectional view of an IGBT (insulated gate bipolar transistor) from two parallel cross-sectional planes in a cell and a gate connection area in accordance with an embodiment providing dual gate contacts for gate electrodes with a thin central portion.

FIGS. 2A and 2B refer to combined cross-sectional views with parallel cross-sections in the gate connection area 610 and the cell area 620 projected into the same plane.

In FIG. 2A the semiconductor device 500 is a vertical IGFET, for example an MOM-ET in the usual meaning including FETs with and without metal gate electrodes. The buried electrode structures 190, the source metallization 310, the gate wiring 330, and the dielectric structure 220 may in substance correspond to the equivalent structures described with reference to FIGS. 1A and 1B.

The distance between two gate contacts 301, 302 assigned to the same gate electrode 350 may be smaller than, for example at most a half of the distance between two gate contacts 301, 302 of different gate electrodes 150. The drift layer 120 may include a weakly doped drift zone 121 and a more heavily doped field stop zone 128. A heavily doped contact layer 130 of the first conductivity type directly adjoins the rear side surface 102 with a rear side electrode structure 320.

In the illustrated embodiment, the first conductivity type is the n-type, the second conductivity type is the p-type and the semiconductor device 500 an n-channel trench FET, for example a power MOSFET. Other embodiments may provide a p-channel trench FET with p-doped source zones 110, drain layer 120 and contact layer 130 and an n-doped body/channel layer 115.

The semiconductor device 500 of FIG. 2B is an IGBT (insulated gate bipolar transistor) with a contact layer 130 of the second conductivity type between the drift layer 120 and the rear side electrode structure 320, wherein the contact layer 130 is effective as a collector layer. Depending on the way the second field dielectric 162 is formed, the protruding portion 162a may be more or less pronounced.

Figure 3A:
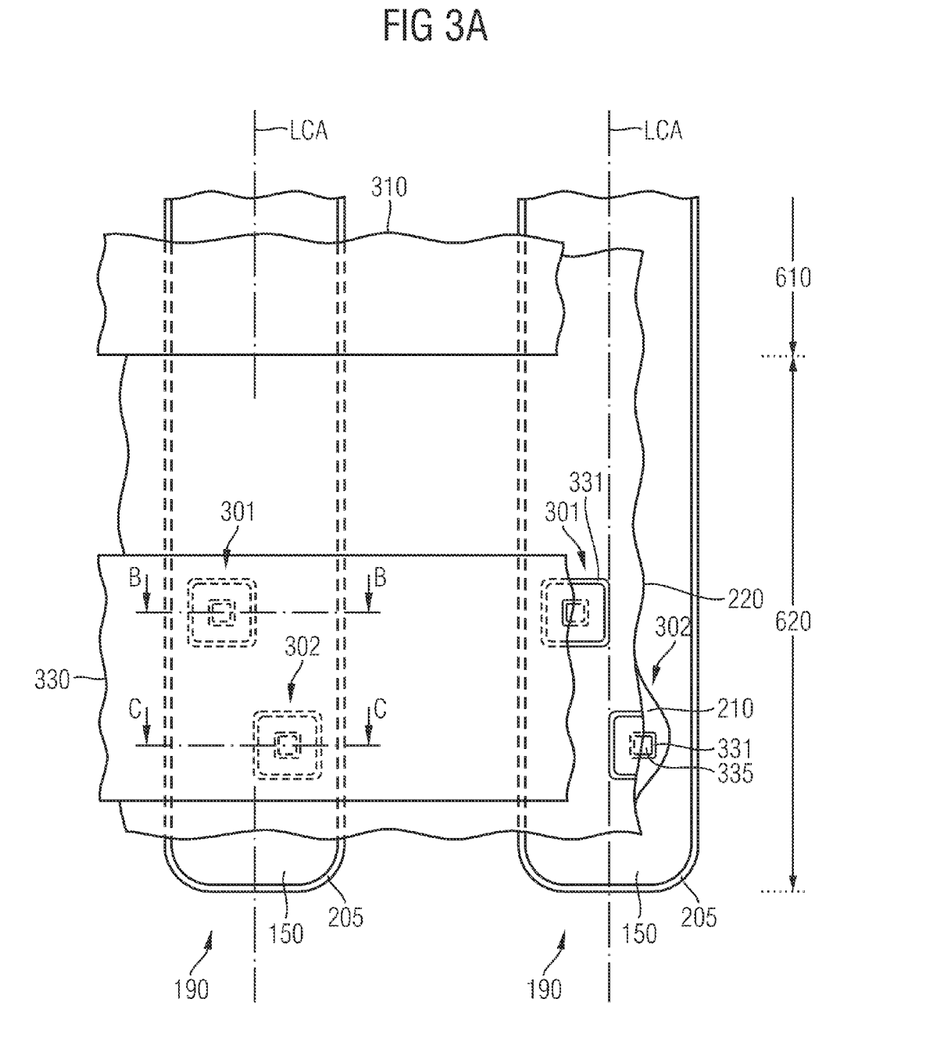
FIG. 3A is a schematic plan view of a gate connection portion of a semiconductor device in accordance with an embodiment providing staggered gate contacts.
Figure 3B:
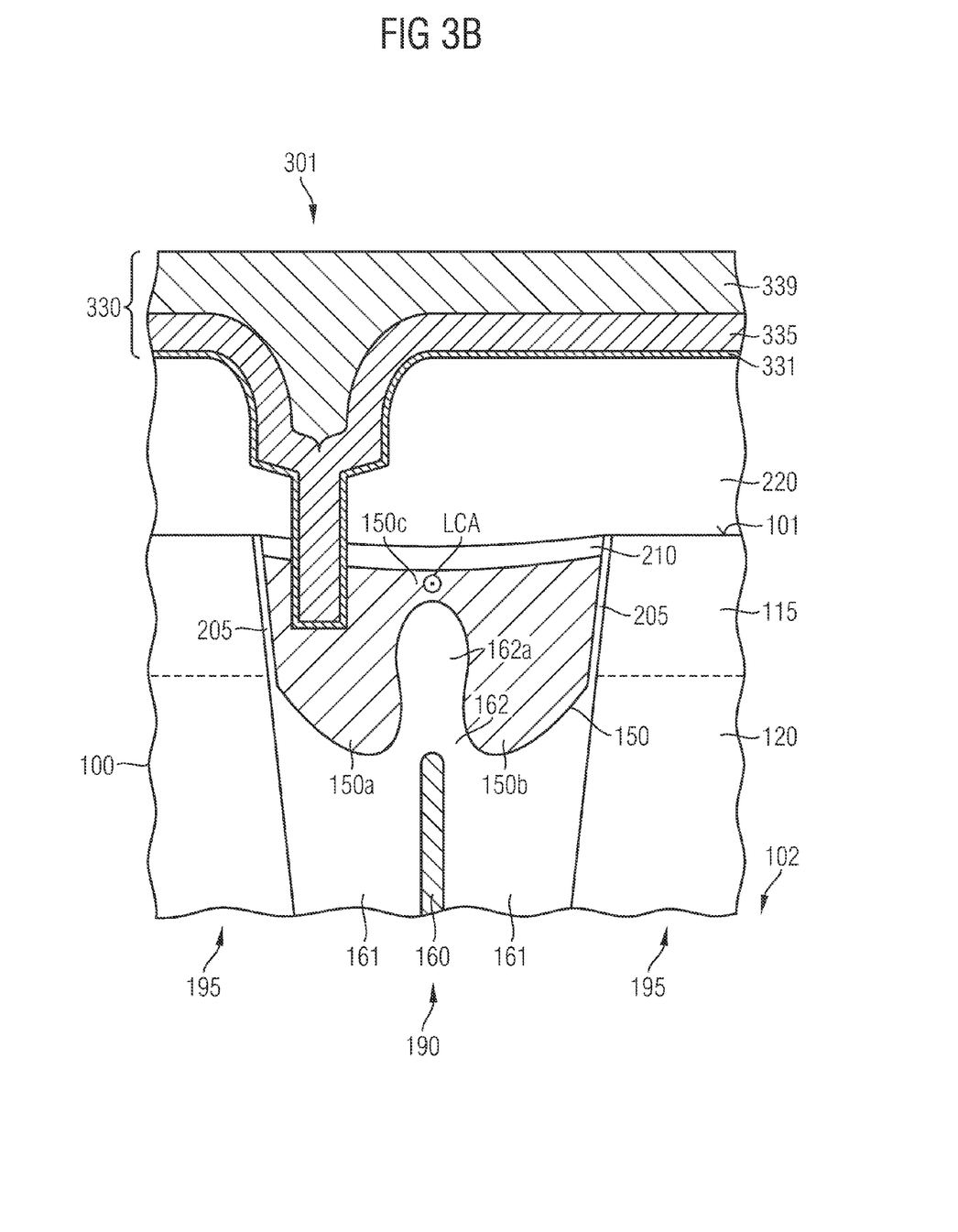
FIG. 3B is a schematic cross-sectional view of the semiconductor device of FIG. 3A along line B-B.
Figure 3C:
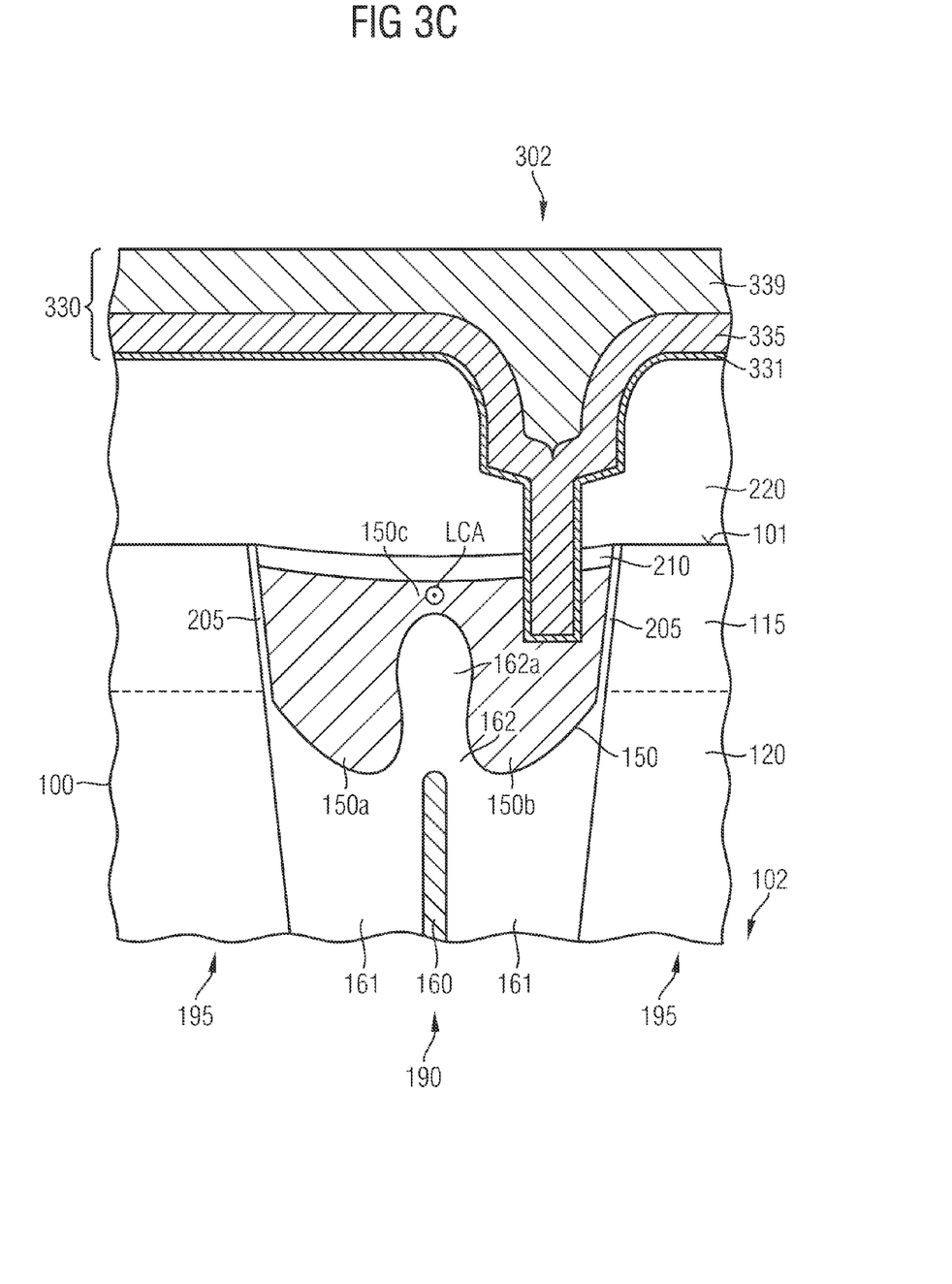
FIG. 3C is a schematic cross-sectional view of the semiconductor device of FIG. 3A along line C-C.

FIGS. 3A to 3C refer to a semiconductor device 500 with the first and second gate contacts 301, 302 arranged in different lateral planes orthogonal to a longitudinal center axis (LCA) resulting in a staggered arrangement of the first and second gate contacts 301, 302.

Stripe-shaped buried electrode structures 190 with longitudinal center axis (LCA) extend along a first lateral direction through a cell area 610 and a gate connection area 620. In the gate connection area 620, gate wirings 330 extend along a second lateral direction intersecting the first lateral direction and cross the buried electrode structures 190, e.g., orthogonally. A source metallization 310 may be provided in the cell area 610.

A first gate contact 301 electrically connects the first gate portion 150a in a first plane orthogonal to the first lateral direction and a second gate contact 302 electrically connects the second gate portion 150b in a second plane orthogonal the first lateral direction, wherein the first and second planes are spaced from each other at the longitudinal center axis (LCA). Both gate electrode "wings," i.e., the first and second portions 150a, 150b, are electrically connected with the gate wiring 330. The first and second gate contacts 301, 302 may be placed on opposite sides of the longitudinal center axis (LCA) of the respective buried electrode structure 190. The first and second gate contacts 301, 302 are arranged at a distance to each other along the first lateral direction. The buried sections of the gate contacts 301, 302 below the main surface 101 have a distance to the longitudinal center axis (LCA) of the concerned gate electrode 150.

For further details reference is made to the description of FIGS. 1A and 1B.

Figure 4:
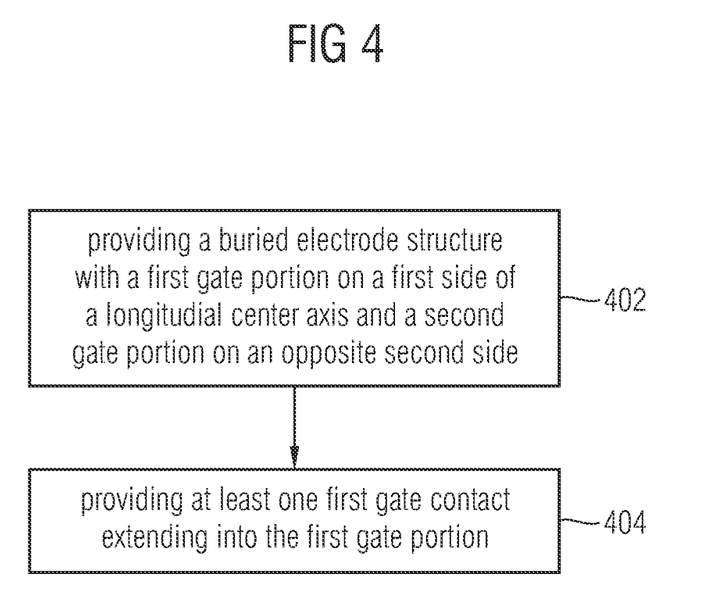
FIG. 4 is a simplified flow-chart of a method of manufacturing a semiconductor device according to a further embodiment.

FIG. 4 schematically illustrates a method of manufacturing a semiconductor device. A buried electrode structure is provided in a semiconductor substrate. The buried electrode structure includes a gate electrode with a first gate portion on a first side of a longitudinal center axis parallel to a main surface of the semiconductor substrate and a second gate portion on an opposite, second side of the longitudinal center axis (402). One or more first gate contacts are provided, wherein the first gate contacts extend from a main side defined by the main surface into the first gate portion at a distance to the longitudinal center axis (404). Contemporaneously with the first gate contacts, one or more second gate contacts may be provided that extend from the main side into the second portion at a distance to the longitudinal center axis.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
  a gate electrode buried in a semiconductor portion comprising a first gate portion on a first side of a longitudinal center axis parallel to a main surface of the semiconductor portion and a second gate portion on an opposite, second side of the longitudinal center axis; and
  at least one first gate contact extending from a main side defined by the main surface into the first gate portion.

2. The semiconductor device according to claim 1, wherein the gate electrode comprises a third gate portion structurally connecting the first and second gate portions and having a vertical extension perpendicular to the main surface smaller than vertical extensions of the first and second gate portions.

3. The semiconductor device according to claim 1, comprising:
  a field electrode dielectrically insulated from the gate electrode and arranged in a vertical projection of a lateral cross-sectional area of the gate electrode between the gate electrode and a rear side surface of the semiconductor portion, the rear side and main surfaces being parallel to each other.

4. The semiconductor device according to claim 1, wherein a top surface of the gate electrode 150 oriented to the main surface is concave.

5. The semiconductor device according to claim 1, wherein two or more first gate contacts extend from the main side into the first portion.

6. The semiconductor device according to claim 1, comprising:
at least one second gate contact extending from the main side into the second portion.

7. The semiconductor device according to claim 6, wherein the first and second gate contacts are arranged along a lateral axis parallel to the main surface and orthogonal to the longitudinal center axis.

8. The semiconductor device according to claim 6, wherein the first and second gate contacts have a same lateral cross-sectional shape and a same vertical extension.

9. The semiconductor device according to claim 6, comprising:
an active transistor area in a semiconductor mesa adjoining the buried gate electrode, wherein a gate dielectric dielectrically insulates the gate electrode from the semiconductor mesa, and
a minimum lateral distance of the first and second contact structures to the gate dielectric is at least 20 nm.

10. The semiconductor device according to claim 6, wherein
the first and second gate contacts are arranged alternately along the longitudinal center axis.

11. The semiconductor device according to claim 6, wherein
sections of the first and second gate contacts below the main surface are spaced from the longitudinal center axis.

12. The semiconductor device according to claim 6, wherein
the first and second gate contacts are arranged mirror-inverted with respect to the longitudinal center axis.

13. The semiconductor device according to claim 6, comprising:
a gate wiring electrically connected to the first and second gate contacts at the main side.

14. The semiconductor device according to claim 13, comprising:
a dielectric structure between the gate wiring and the gate electrode.

15. A method of manufacturing a semiconductor device, the method comprising:
providing a buried electrode structure in a semiconductor substrate, the buried electrode structure comprising a gate electrode that comprises a first gate portion on a first side of a longitudinal center axis parallel to a main surface of the semiconductor substrate and a second gate portion on an opposite, second side of the longitudinal center axis; and
providing at least a first gate contact extending from a main side defined by the main surface into the first gate portion.

16. The method according to claim 15, further comprising:
providing, contemporaneously with the at least one first gate contact, at least one second gate contact extending from the main side into the second gate portion.

17. The method according to claim 15, further comprising:
forming source contacts to impurity zones formed in semiconductor mesas between the buried electrode structures, wherein a single photolithographic mask is used for defining contact grooves for the source and gate contacts.

18. The method according to claim 15, further comprising:
implanting impurities through bottom regions of the contact grooves for the source and gate contacts before providing the source and gate contacts in the contact grooves.

19. The method according to claim 15, further comprising:
providing a field electrode in the buried electrode structure before providing the gate electrode, wherein a first field dielectric dielectrically insulates the field electrode from the semiconductor substrate.

20. The method according to claim 19, further comprising:
providing a second field dielectric in the buried electrode structure before providing the gate electrode, wherein an exposed protruding portion of a field electrode material is oxidized to form a protruding portion of the second field dielectric patterning the gate electrode from the side of the field electrode.

\* \* \* \* \*